US006268288B1

United States Patent
Hautala et al.

(10) Patent No.: US 6,268,288 B1
(45) Date of Patent: Jul. 31, 2001

(54) PLASMA TREATED THERMAL CVD OF TAN FILMS FROM TANTALUM HALIDE PRECURSORS

(75) Inventors: John J. Hautala, Beverly; Johannes F. M. Westendorp, Rockport, both of MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/300,659

(22) Filed: Apr. 27, 1999

(51) Int. Cl.[7] .................................................. H01L 21/44
(52) U.S. Cl. ........................... 438/680; 438/685; 438/695
(58) Field of Search ..................... 438/648, 656, 438/674, 680, 685, 695, 697

(56) References Cited

U.S. PATENT DOCUMENTS

| | | | |
|---|---|---|---|
| 4,535,000 | 8/1985 | Gordon | 427/160 |
| 4,678,769 | 7/1987 | King | 502/231 |
| 4,859,617 | 8/1989 | Nomoto et al. | 437/40 |
| 4,882,224 | 11/1989 | Moro et al. | 428/403 |
| 4,884,123 | 11/1989 | Dixit et al. | 357/71 |
| 5,017,403 | 5/1991 | Pang et al. | 427/39 |
| 5,173,327 | 12/1992 | Sandhu et al. | 427/573 |
| 5,177,589 | 1/1993 | Kobayashi et al. | 257/773 |
| 5,271,963 | 12/1993 | Eichman et al. | 427/248.1 |
| 5,326,404 | 7/1994 | Sato | 118/723 |
| 5,380,678 | 1/1995 | Yu et al. | 437/190 |
| 5,466,971 | 11/1995 | Higuchi | 257/751 |
| 5,780,115 | * 7/1998 | Park et al. | 427/539 |
| 5,919,531 | * 7/1999 | Arkles et al. | 427/576 |

FOREIGN PATENT DOCUMENTS 0 818 560    1/1998  (EP) .
0 869 544    10/1998 (EP) .

OTHER PUBLICATIONS

Kaloyeros et al., *Tantalum Nitride Films Grown by Inorganic Low Temperature Thermal Chemical Vapor Deposition*, J. of the Electrochemical Society 146 (1) 170–176 (1999).

Funakubo et al., *Preparation of TaNx–TiN Films by CVD*, J. Ceramic Soc. Jpn. Int. Ed. vol. 98 (173–178) (1990).

* cited by examiner

Primary Examiner—Olik Chaudhuri
Assistant Examiner—Ginette Peralta
(74) Attorney, Agent, or Firm—Wood, Herron & Evans, LLP

(57) ABSTRACT

A plasma treated chemical vapor deposition (PTTCVD) method for depositing high quality conformal tantalum nitride ($TaN_x$) films from inorganic tantalum halide ($TaX_5$) precursors and a nitrogen containing gas is described. The inorganic tantalum halide precursors are tantalum pentafluoride ($TaF_5$), tantalum pentachloride ($TaCl_5$) and tantalum pentabromide ($TaBr_5$). In a thermal CVD process, a $TaX_5$ vapor is delivered into a heated chamber. The vapor is combined with a process gas containing nitrogen to deposit a $TaN_x$ film on a substrate that is heated to 300° C.–500° C. A hydrogen gas is introduced in a radiofrequency generated plasma to plasma treat the $TaN_x$ film. The plasma treatment is performed periodically until a desired $TaN_x$ film thickness is achieved. The PTTCVD films have improved microstructure and reduced resistivity with no change in step coverage. The deposited $TaN_x$ film is useful for integrated circuits containing copper films, especially in small high aspect ratio features. The high conformality of these films is superior to films deposited by PVD.

38 Claims, 5 Drawing Sheets

PLASMA TREATED THERMAL CVD OF TAN FILMS FROM TANTALUM HALIDE PRECURSORS

FIELD OF THE INVENTION

The invention relates to the formation of integrated circuits, and specifically to chemical vapor deposition of tantalum nitride films from tantalum halide precursors.

BACKGROUND

Integrated circuits (IC) provide the pathways for signal transport in an electrical device. An IC in a device is composed of a number of active transistors contained in a silicon base layer of a semiconductor substrate. To increase the capacity of an IC, large numbers of interconnections with metal "wires" are made between one active transistor in the silicon base of the substrate and another active transistor in the silicon base of the substrate. The interconnections, collectively known as the metal interconnection of a circuit, are made through holes, vias or trenches that are cut into a substrate. The particular point of the metal interconnection which actually makes contact with the silicon base is known as the contact. The remainder of the hole, via or trench is filled with a conductive material, termed a contact plug. As transistor densities continue to increase, forming higher level integrated circuits, the diameter of the contact plug must decrease to allow for the increased number of interconnections, multilevel metalization structures and higher aspect ratio vias.

Aluminum has been the accepted standard for contacts and interconnections in integrated circuits. However, problems with aluminum electromigration and its high electrical resistivity require new materials for newer structures having submicron dimensions. Copper holds promise as the interconnect material for the next generation of integrated circuits in ultra large scale integration (ULSI) circuitry, yet the formation of copper silicide (Cu—Si) compounds at low temperatures and its electromigration through a silicon oxide ($SiO_2$) layer are disadvantages to its use.

As the shift occurs from aluminum to copper as an interconnect element of choice, new materials are required to serve as a barrier, preventing copper diffusion into the underlying dielectric layers of the substrate and to form an effective "glue" layer for subsequent copper deposition. New materials are also required to serve as a liner, adhering subsequently deposited copper to the substrate. The liner must also provide a low electrical resistance interface between copper and the barrier material. Barrier layers that were previously used with aluminum, such as titanium (Ti) and titanium nitride (TiN) barrier layers deposited either by physical vapor deposition (PVD) such as sputtering and/or chemical vapor deposition (CVD), are ineffective as diffusion barriers to copper. In addition, Ti reacts with copper to form copper titanium compounds at the relatively low temperatures used with PVD and/or CVD.

Sputtered tantalum (Ta) and reactive sputtered tantalum nitride (TaN) have been demonstrated to be good diffusion barriers between copper and a silicon substrate due to their high conductivity, high thermal stability and resistance to diffusion of foreign atoms. However, the deposited Ta and/or TaN film has inherently poor step coverage due to its shadowing effects. Thus the sputtering process is limited to relatively large feature sizes (>0.3 $\mu$m) and small aspect ratio contacts and vias. CVD offers the inherent advantage over PVD of better conformality, even in small structures (<0.25 $\mu$m) with high aspect ratios. However, CVD of Ta and TaN with metal-organic sources such as tertbutylimidotris (diethylamido)tantalum (TBTDET), pentakis (dimethylamino) tantalum (PDMAT) and pentakis (diethylanmino) tantalum (PDEAT) yields mixed results. Additional problems are that all resulting films have relatively high concentrations of oxygen and carbon impurities and require the use of a carrier gas.

The need to use a carrier gas presents the disadvantage that the concentration of the precursor gas in the carrier is not precisely known. As a result, accurate metering of a mixture of a carrier gas and a precursor gas to the CVD reaction chamber does not insure accurate metering of the precursor gas alone to the reactor. This can cause the reactants in the CVD chamber to be either too rich or too lean. The use of a carrier gas also presents the disadvantage that particulates are frequently picked up by the flowing carrier gas and delivered as contaminants to the CVD reaction chamber. Particulates on the surface of a semiconductor wafer during processing can result in the production of defective semiconductor devices.

Thus, a process to deposit TaN at the relatively low temperatures used in PECVD (<500° C.) would provide an advantage in the formation of copper barriers for the next generation of IC. Ideally, the deposited film will have a high step coverage (the ratio of the coating thickness at the bottom of a feature to the thickness on the sides of a feature or on the top surface of the substrate or wafer adjacent the feature), good diffusion barrier properties, minimal impurities, low resistivity, good conformality (even coverage of complex topography of high aspect ratio features), and ideally the process will have a high deposition rate.

SUMMARY OF THE INVENTION

The invention is directed to a method of depositing a tantalum nitride ($TaN_x$) film from a tantalum halide precursor on a substrate. The tantalum halide precursor is delivered at a temperature sufficient to vaporize the precursor to provide a vaporization pressure to deliver the tantalum vapor to a reaction chamber containing the substrate. The vaporization pressure is greater than about 3 Torr. The vapor is combined with a process gas containing nitrogen and $TaN_x$ is deposited on the substrate by a thermal chemical vapor deposition (thermal CVD) process. The deposition is halted to plasma treat the film surface, then deposition is resumed. The plasma treatments are performed at regular intervals in the thermal CVD process (PTTCVD) until a desired film thickness is obtained. The tantalum halide precursor is tantalum fluoride (TaF), tantalum chloride (TaCl) or tantalum bromide (TaBr), preferably tantalum pentafluoride ($TaF_5$), tantalum pentachloride ($TaCl_5$) or tantalum pentabromide ($TaBr_5$). The substrate temperature is in the range of about 300° C.–500° C.

The invention is also directed to a method of depositing a $TaN_x$ film from a $TaF_5$ or $TaCl_5$ precursor on a substrate by elevating the precursor temperature sufficient to vaporize the precursor to provide a pressure to deliver the vapor. The vapor is combined with a process gas containing nitrogen and $TaN_x$ is deposited on the substrate by a thermal chemical vapor deposition (thermal CVD) process. The deposition is halted to plasma treat the film surface, then deposition is resumed. The plasma treatments are performed at regular intervals in the thermal CVD process until a desired film thickness is obtained.

The invention is further directed to method of depositing a $TaN_x$ film from a $TaBr_5$ precursor on a substrate without a carrier gas. The temperature of the precursor is elevated sufficient to produce a tantalum vapor. The vapor is combined with a process gas containing nitrogen and $TaN_x$ is deposited on the substrate by a thermal chemical vapor deposition (thermal CVD) process. The deposition is halted to plasma treat the film surface, then deposition is resumed. The plasma treatments are performed at regular intervals in the thermal CVD process until a desired film thickness is obtained.

The invention is still further directed to a substrate integral with a copper (Cu) layer and a $TaN_x$ layer in which diffusion of Cu is prevented by the $TaN_x$ layer.

The $TaN_x$ layer deposited by plasma treated thermal CVD according to the invention has minimal impurities and low resistivity. The film provides good step coverage, good conformality in high aspect ratio features and is a good diffusion barrier to a copper film.

It will be appreciated that the disclosed method and substrates of the invention have an array of applications. These and other advantages will be further understood with reference to the following drawings and detailed description.

DETAILED DESCRIPTION

Refractory transition metals such as tantalum (Ta) and their nitride films (TaN) are effective diffusion barriers to copper (Cu). Their effectiveness is due to their high thermal stability, high conductivity and resistance to diffusion of foreign elements or impurities. Ta and TaN are especially attractive due to their chemical inertness with Cu; no compounds form between Cu and Ta or Cu and N.

Tantalum halides provide a convenient inorganic source for Ta and TaN. Specifically, the inorganic precursor is a tantalum pentahalide ($TaX_5$) where X represents the halides fluorine (F), chlorine (Cl) and bromine (Br). Table 1 shows relevant thermodynamic properties of the tantalum halide precursors, specifically tantalum pentafluoride ($TaF_5$), tantalum pentachloride ($TaCl_5$) and tantalum bromide ($TaBr_5$), with tantalum pentaiodide ($TaI_5$) included for comparison. The $TaF_5$, $TaCl_5$ and $TaBr_5$ precursor materials are all solids at room temperature (18° C.–22° C.).

TABLE 1

| PRECURSOR | MELTING POINT | BOILING POINT | CHANGE IN HEAT OF FORMATION (ΔHf) |
|---|---|---|---|
| $TaF_5$ | 97° C. | 230° C. | −455 kcal/mole |
| $TaCl_5$ | 216° C. | 242° C. | −205 kcal/mole |
| $TaBr_5$ | 265° C. | 349° C. | −143 kcal/mole |
| $TaI_5$ | 367° C. | 397° C. | −82 kcal/mole |

Figure 1:
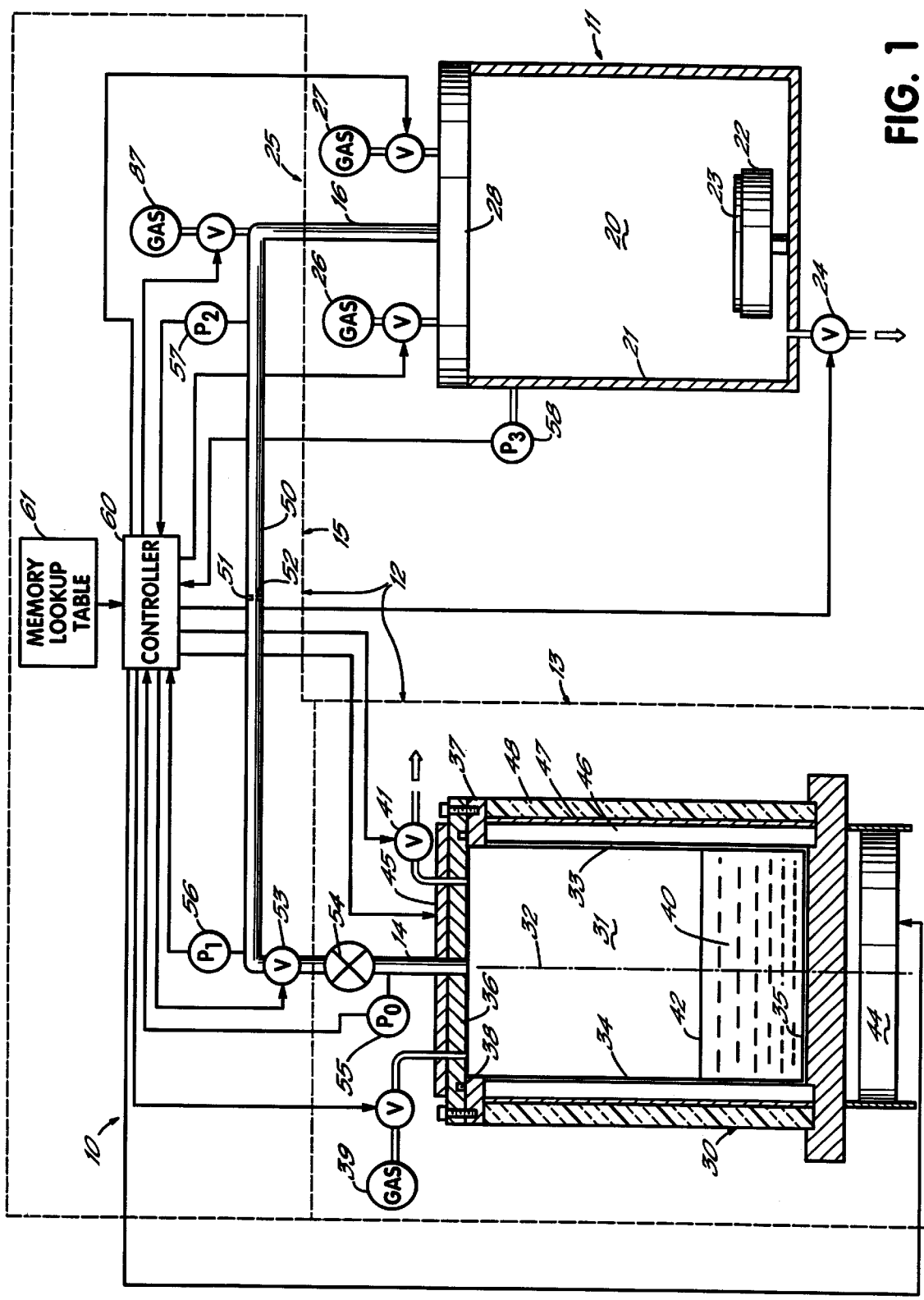
FIG. 1 is a schematic of an apparatus for plasma treated thermal chemical vapor deposition (PTTCVD).

In chemical vapor deposition (CVD) processes, gas precursors are activated using either thermal energy or electrical energy. Upon activation, the gas precursors react chemically to form a film. A preferred method of CVD is illustrated in FIG. 1 and is disclosed in a copending application entitled APPARATUS AND METHODS FOR DELIVERY OF VAPOR FROM SOLID SOURCES TO A CVD CHAMBER by Westendorp et al. filed on the same date as the present application and assigned to Tokyo Electron Limited and incorporated by reference herein in its entirety. A chemical vapor deposition (CVD) system 10 includes a CVD reaction chamber 11 and a precursor delivery system 12. In the reaction chamber, a reaction is carried out to convert a precursor gas of, for example, tantalum chloride (TaCl) or other tantalum halide compound, into a film such as a barrier layer film of tantalum (Ta) or tantalum nitride (TaN). The TaN film is not limited to any particular stoichiometry ($TaN_x$), since $TaN_x$ can be continuously varied by changing the ratio of gases in any given deposition. Thus, as used herein, $TaN_x$ encompasses a tantalum nitride film of any stoichiometry.

The precursor delivery system 12 includes a source 13 of precursor gas having a gas outlet 14, which communicates through a metering system 15 with a gas inlet 16 to the CVD reaction chamber 11. The source 13 generates a precursor gas, for example a tantalum halide vapor, from a tantalum halide compound. The compound is one that is in a solid state when at standard temperature and pressure. The precursor source is maintained, preferably by controlled heating, at a temperature that will produce a desired vapor pressure of precursor. Preferably, the vapor pressure is one that is itself sufficient to deliver the precursor vapor to the reaction chamber, preferably without the use of a carrier gas. The metering system 15 maintains a flow of the precursor gas vapor from the source 13 into the reaction chamber at a rate that is sufficient to maintain a commercially viable CVD process in the reaction chamber.

The reaction chamber 11 is a generally conventional CVD reactor and includes a vacuum chamber 20 that is bounded by a vacuum tight chamber wall 21. In the chamber 20 is situated a substrate support or susceptor 22 on which a substrate such as a semiconductor wafer 23 is supported. The chamber 20 is maintained at a vacuum appropriate for the performance of a CVD reaction that will deposit a film such as a Ta/$TaN_x$ barrier layer on the semiconductor wafer substrate 23. A preferred pressure range for the CVD reaction chamber 11 is in the range of from 0.2 to 5.0 Torr. The vacuum is maintained by controlled operation of a vacuum pump 24 and of inlet gas sources 25 that include the delivery system 12 and may also include reducing gas sources 26 of, for example, hydrogen ($H_2$), nitrogen ($N_2$) or ammonia ($NH_3$) for use in carrying out a tantalum reduction reaction, and an inert gas source 27 for a gas such as argon (Ar) or helium (He). The gases from the sources 25 enter the chamber 20 through a showerhead 28 that is situated at one end of the chamber 20 opposite the substrate 23, generally parallel to and facing the substrate 23.

The precursor gas source 13 includes a sealed evaporator 30 that includes a cylindrical evaporation vessel 31 having a vertically oriented axis 32. The vessel 31 is bounded by a cylindrical wall 33 formed of a high temperature tolerant and non-corrosive material such as the alloy INCONEL 600, the inside surface 34 of which is highly polished and smooth. The wall 33 has a flat circular closed bottom 35 and an open top, which is sealed by a cover 36 of the same heat tolerant and non-corrosive material as the wall 33. The outlet 14 of the source 13 is situated in the cover 36. When high temperatures are used, such as with $TiI_4$ or $TaBr_5$, the cover 36 is sealed to a flange ring 37 that is integral to the top of the wall 33 by a high temperature tolerant vacuum compatible metal seal 38 such as a HELICOFLEX seal, which is formed of a C-shaped nickel tube surrounding an INCONEL coil spring. With materials requiring lower temperatures, such as, $TaCl_5$ and $TaF_5$, a conventional elastomeric O-ring seal may be used to seal the cover.

Connected to the vessel 31 through the cover 36 is a source 39 of a carrier gas, which is preferably an inert gas such as He or Ar. The source 13 includes a mass of precursor material such as tantalum fluoride, chloride or bromide (TaX), preferably as the pentahalide ($TaX_5$), at the bottom of the vessel 31, which is loaded into the vessel 31 at standard temperature and pressure in a solid state. The vessel 31 is filled with tantalum halide vapor by sealing the chamber with the solid mass of $Ta_X$ therein. The halide is supplied as a precursor mass 40 that is placed at the bottom of the vessel 31, where it is heated, preferably to a liquid state as long as the resulting vapor pressure is in an acceptable range. Where the mass 40 is liquid, the vapor lies above the level of the liquid mass 40. Because wall 33 is a vertical cylinder, the surface area of TaX mass 40, if a liquid, remains constant regardless of the level of depletion of the TaX.

The delivery system 12 is not limited to direct delivery of a precursor 40 but can be used in the alternative for delivery of precursor 40 along with a carrier gas, which can be introduced into the vessel 31 from gas source 39. Such a gas may be hydrogen ($H_2$) or an inert gas such as helium (He) or argon (Ar). Where a carrier gas is used, it may be introduced into the vessel 31 so as to distribute across the top surface of the precursor mass 40 or may be introduced into the vessel 31 so as to percolate through the mass 40 from the bottom 35 of the vessel 31 with upward diffusion in order to achieve maximum surface area exposure of the mass 40 to the carrier gas. Yet another alternative is to vaporize a liquid that is in the vessel 31. However, such alternatives add undesired particulates and do not provide the controlled delivery rate achieved by the direct delivery of the precursor, that is, delivery without the use of a carrier gas. Therefore, direct delivery of the precursor is preferred.

Figure 2:
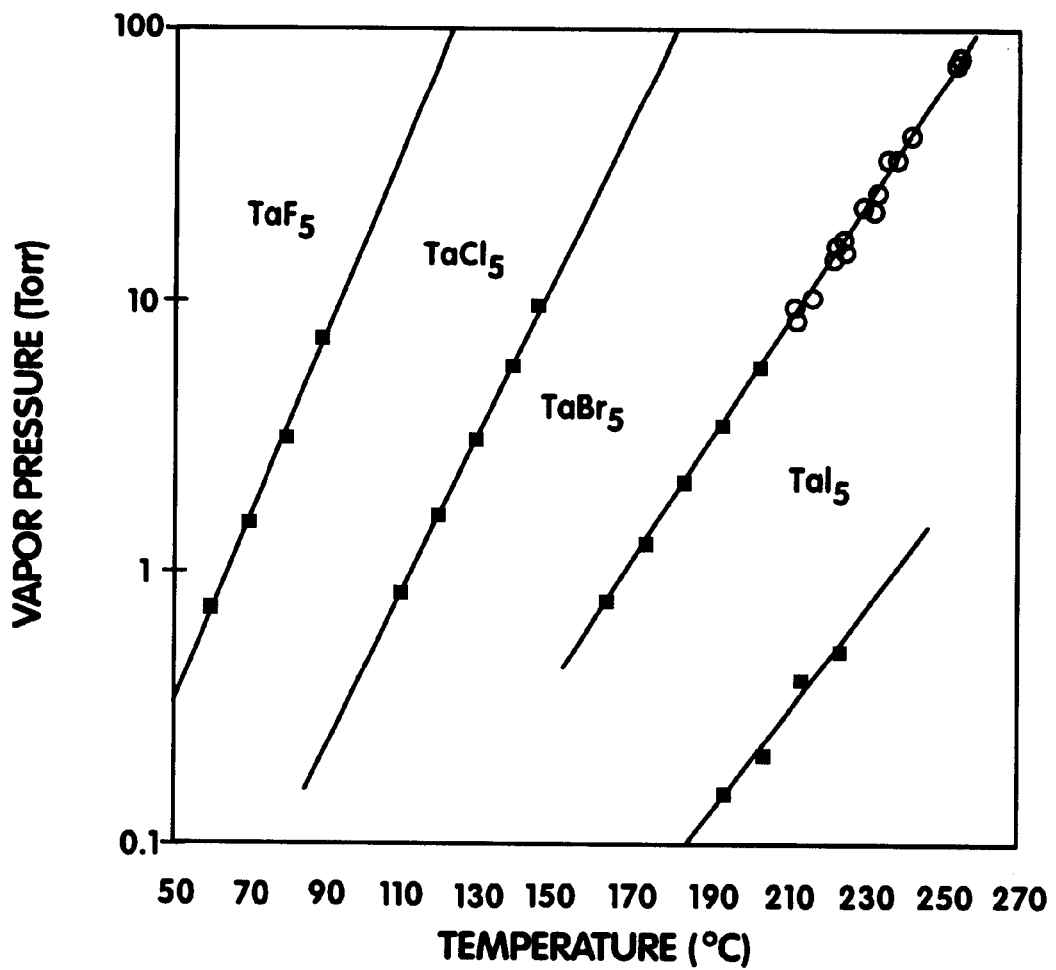
FIG. 2 is a graph of vapor pressure versus temperature for tantalum halides.

To maintain the temperature of the precursor 40 in the vessel 31, the bottom 35 of the wall 33 is maintained in thermal communication with a heater 44, which maintains the precursor 40 at a controlled temperature, preferably above its melting point, that will produce a vapor pressure greater than about 3 Torr in the absence of a carrier gas (i.e., a direct delivery system), and a lower vapor pressure such as about 1 Torr when a carrier gas is used. The exact vapor pressure depends upon other variables such as the quantity of carrier gas the surface area of the substrate and so on. In a direct system for tantalum, a vapor pressure can be maintained at the preferred pressure of 5 Torr or above by heating the a tantalum halide precursor in the 95° C. to 205° C. range as shown in FIG. 2. For $TaX_5$ the desired temperature is at least about 95° C. for $TaF_5$, the desired temperature is at least about 145° C. for $TaCl_5$, and the desired temperature is at least about 205° C. for $TaBr_5$. The melting points of the respective fluoride, chloride and bromide tantalum pentahalide compounds are in the 97° C. to 265° C. range. A much higher temperature is required for tantalum pentaiodide ($TaI_5$) to produce a sufficient vapor pressure in the vessel 31. Temperatures should not be so high as to cause premature reaction of the gases in the showerhead 28 or otherwise before contacting the wafer 23.

For purposes of example, a temperature of 180° C. is assumed to be the control temperature for the heating of the bottom 35 of the vessel 31. This temperature is appropriate for producing a desired vapor pressure with a titanium tetraiodide ($TiI_4$) precursor. Given this temperature at the bottom 35 of the vessel 31, to prevent condensation of the precursor vapor on the walls 33 and cover 36 of the vessel 31, the cover is maintained at a higher temperature than the heater 44 at the bottom 35 of the wall 33 of, for example, 190° C., by a separately controlled heater 45 that is in thermal contact with the outside of the cover 36. The sides of the chamber wall 33 are surrounded by an annular trapped air space 46, which is contained between the chamber wall 33 and a surrounding concentric outer aluminum wall or can 47. The can 47 is further surrounded by an annular layer of silicon foam insulation 48. This temperature maintaining arrangement maintains the vapor in a volume of the vessel 31 bounded by the cover 36, the sides of the walls 33 and the surface 42 of the precursor mass 40 in the desired example temperature range of between 180° C. and 190° C. and the pressure greater than about 3 Torr, preferably at greater than 5 Torr. The temperature that is appropriate to maintain the desired pressure will vary with the precursor material, which is primarily contemplated as a being tantalum or titanium halide compound.

The vapor flow metering system 15 includes a delivery tube 50 of at least ½ inch in diameter, or at least 10 millimeters inside diameter, and preferably larger so as to provide no appreciable pressure drop at the flow rate desired, which is at least approximately 2 to 40 standard cubic centimeters per minute (sccm). The tube 50 extends from the precursor gas source 13 to which it connects at its upstream end to the outlet 14, to the reaction chamber to which it connects at its downstream end to the inlet 16. The entire length of the tube 50 from the evaporator outlet 14 to the reactor inlet 16 and the showerhead 28 of the reactor chamber 20 are also preferably heated to above the evaporation temperature of the precursor material 40, for example, to 195° C.

In the tube 50 is provided baffle plate 51 in which is centered a circular orifice 52, which preferably has a diameter of approximately 0.089 inches. The pressure drop from gauge 1 56 to gauge 2 57 is regulated by control valve 53. This pressure drop after control valve 53 through orifice 52 and into reaction chamber 11 is greater than about 10 milliTorr and will be proportional to the flow rate. A shut-off valve 54 is provided in the line 50 between the outlet 14 of the evaporator 13 and the control valve 53 to close the vessel 31 of the evaporator 13.

Pressure sensors 55–58 are provided in the system 10 to provide information to a controller 60 for use in controlling the system 10, including controlling the flow rate of precursor gas from the delivery system 15 into the chamber 20 of the CVD reaction chamber. The pressure sensors include sensor 55 connected to the tube 50 between the outlet 14 of the vaporator 13 and the shut-off valve 54 to monitor the pressure in the evaporation vessel 31. A pressure sensor 56 is connected to the tube 50 between the control valve 53 and the baffle 51 to monitor the pressure upstream of the orifice 52, while a pressure sensor 57 is connected to the tube 50 between the baffle 51 and the reactor inlet 16 to monitor the pressure downstream of the orifice 52. A further pressure sensor 58 is connected to the chamber 20 of the reaction chamber to monitor the pressure in the CVD chamber 20.

Control of the flow of precursor vapor into the CVD chamber 20 of the reaction chamber is achieved by the controller 60 in response to the pressures sensed by the sensors 55–58, particularly the sensors 56 and 57 which determine the pressure drop across the orifice 52. When the conditions are such that the flow of precursor vapor through the orifice 52 is unchoked flow, the actual flow of precursor vapor through the tube 52 is a function of the pressures monitored by pressure sensors 56 and 57, and can be determined from the ratio of the pressure measured by sensor 56 on the upstream side of the orifice 52, to the pressure measured by sensor 57 on the downstream side of the orifice 52.

When the conditions are such that the flow of precursor vapor through the orifice 52 is choked flow, the actual flow of precursor vapor through the tube 52 is a function of only the pressure monitored by pressure sensor 57. In either case, the existence of choked or unchoked flow can be determined by the controller 60 by interpreting the process conditions. When the determination is made by the controller 60, the flow rate of precursor gas can be determined by the controller 60 through calculation.

Preferably, accurate determination of the actual flow rate of precursor gas is calculated by retrieving flow rate data from lookup or multiplier tables stored in a non-volatile memory 61 accessible by the controller 60. When the actual flow rate of the precursor vapor is determined, the desired flow rate can be maintained by a closed loop feedback control of one or more of the variable orifice control valve 53, the CVD chamber pressure through evacuation pump 24 or control of reducing or inert gases from sources 26 and 27, or by control of the temperature and vapor pressure of the precursor gas in vessel 31 by control of heaters 44, 45.

As shown in FIG. 1, the solid $TaF_5$, $TaCl_5$ and $TaBr_5$ precursor material 40 is sealed in a cylindrical corrosion resistant metal vessel 31 that maximizes the available surface area of the precursor material. Vapor from either $TaF_5$, $TaCl_5$ or $TaBr_5$ was delivered directly, that is, without the use of a carrier gas, by a high conductance delivery system into a reaction chamber 11. The reaction chamber 11 was heated to a temperature of at least about 100° C. to prevent condensation of vapor or deposition by-products.

The controlled direct delivery of tantalum halide vapor into the reaction chamber 11 was accomplished by heating the solid tantalum halide precursor 40 to a temperature in the range of about 95° C.–205° C., the choice depending upon the particular precursor. The temperature was sufficient to vaporize the precursor 40 to provide a vapor pressure to deliver the tantalum halide vapor to the reaction chamber 11. Thus, a carrier gas was not necessary and preferably was not used. A sufficient vapor pressure was in the range of about 3–10 Torr. This pressure was required to maintain a constant pressure drop across a defined orifice in a high conductance delivery system while delivering up to about 50 sccm tantalum halide precursor to a reaction chamber 11 operating in the range of about 0.1–2.0 Torr. The temperatures to obtain the desired pressures in a direct delivery system were in the range of about 83° C.–95° C. and preferably about 95° C. with $TaF_5$, in the range of about 130° C.–150° C. and preferably about 145° C. with $TaCl_5$, and in the range of about 202° C.–218° C. and preferably about 205° C. with $TaBr_5$. Under these conditions, $TaF_5$ is a liquid while $TaCl_5$ and $TaBr_5$ remain solid.

FIG. 2 shows the relationship between the measured vapor pressure and temperature for the precursors $TaF_5$, $TaCl_5$ and $TaBr_5$, with $TaI_5$ included for comparison. As previously stated, the desired pressure was greater than about 3 Torr and preferably greater than 5 Torr. Also, as previously stated, the vapor pressure for $TaF_5$, $TaCl_5$ and $TaBr_5$ was desirably low enough to be able to deposit tantalum in the absence of a carrier gas but yet sufficient to maintain a constant pressure drop across a defined orifice in a high conductance delivery system and still be able to deliver up to 50 sscm $TaX_5$ to a reaction chamber 11 operating at 0.1–2.0 Torr. The vapor pressure for $TaI_5$ was determined to be too low for practical implementation in the described apparatus. For $TaBr_5$ the open circles represent published values, while closed squares for $TaBr_5$, $TaF_5$, $TaCl_5$ and $TaI_5$ represent the inventors' experimental data.

A parallel plate RF discharge was used where the driven electrode was the gas delivery showerhead and the susceptor 22 or stage for the wafer or substrate 23 was the RF ground. The selected $TaX_5$ vapor was combined with other process gases such as $H_2$ above the substrate, which had been heated to a temperature between about 300° C.–500° C. Ar and He could also be used, either singularly or in combination, as process gases in addition to $H_2$.

The thermal CVD is stopped at regular intervals to plasma treat the film surface. The flow of tantalum halide precursor gas and process gas is turned off or is directed around the reaction chamber 11 and a plasma treatment is then performed on the surface of the film. For the plasma treatment a parallel plate RF discharge is used where the driven electrode is the gas delivery showerhead and the wafer stage is the RF ground. $H_2$ was used to plasma treat the film at a flow of 7 slm, after which thermal CVD was resumed. The depositing, plasma treating and resumed depositing steps continued until the desired film thickness was obtained. The plasma treatment of films deposited by thermal CVD, that is, the plasma treated thermal CVD (PTTCVD) process, could decrease the film's electrical resistivity by a factor of greater than ten thousand. In addition, PTTCVD improves the film's morphology from a relatively rough structure to a smooth dense film.

Process conditions for deposition of good quality PTTCVD $TaN_x$ films are given in Table 2.

TABLE 2

| | |
|---|---|
| Substrate Temperature | 300° C.–500° C. |
| $TaX_5$ temperature | 95° C. ($TaF_5$), 145° C. ($TaCl_5$), 205° C. ($TaBr_5$) |
| $TaX_5$ flow | 1–50 sccm |
| $NH_3$ flow | 0.1–10 slm |
| $H_2$ flow | 0.1–10 slm |
| $N_2$ flow | 0–10 slm |
| Ar, He flow | 0–10 slm |
| Process Pressure | 0.2–5.0 Torr |
| RF Power | 0.1–5.0 W/cm$^2$ |

The $TaF_5$ and $TaBr_5$ based PTTCVD $TaN_x$ film properties for representative process conditions are given in Table 3.

TABLE 3

| Film | Precursor | TaX$_5$ flow (sccm) | NH$_3$ flow (slm) | Pressure (Torr) | Temp. (° C.) | # cycles | Thick/ cycle | H$_2$ flow (slm) | RF (Watts) | Resistivity ($\mu\Omega$cm) | step coverage | Halide conc (atomic %) |
|---|---|---|---|---|---|---|---|---|---|---|---|---|
| TaN | TaF$_5$ | 14 | 0.4 | 0.2 | 440 | 0 | | | | < 1 × 10$^7$ | 1 | <2 |
| TaN | TaF$_5$ | 14 | 0.4 | 0.2 | 440 | 10 | 70 | 7 | 200 | 3600 | 1 | <2 |
| TaN | TaF$_5$ | 14 | 0.4 | 0.2 | 440 | 15 | 45 | 7 | 200 | 1100 | 1 | <2 |
| TaN | TaBr$_5$ | 20 | 1 | 1 | 430 | 0 | | | | < 1 × 10$^7$ | 0.6 | <2 |
| TaN | TaBr$_5$ | 20 | 1 | 1 | 430 | 6 | 105 | 7 | 200 | 32000 | 1 | <2 |
| TaN | TaBr$_5$ | 20 | 1 | 1 | 430 | 10 | 20 | 7 | 200 | 5800 | 1 | <2 |

As shown in Table 3, the resistivities of the films that did not undergo the plasma treatment were high, greater than 1×10$^7$ $\mu\omega$cm, which was the limit of the measurement tool. As thinner layers of TaN$_x$ films deposited by thermal CVD were treated by the hydrogen RF discharge, lower resistivities were obtained. The electrical resistivity of the PTTCVD TaF$_5$ based film decreased from greater than 1×10$^7$ $\mu\omega$cm in the untreated state to 3600 $\mu\omega$cm when a 70 Å thick TaN$_x$ film per cycle was subjected to plasma treatment. The resistance further decreased to 1100 $\mu\omega$cm when a 45 Å thick TaN$_x$ film per cycle was subjected to plasma treatment. Similarly, the electrical resistivity of the PTTCVD TaBr$_5$ based film decreased from greater than 1×10$^7$ $\mu\omega$cm for untreated films to 32,000 $\mu\omega$cm when a 105 Å TaN$_x$ film per cycle was subjected to plasma treatment. A further decrease to 5800 $\mu\omega$cm was obtained when a 20 Å thick TaN$_x$ film per cycle was subjected to plasma treatment. A TaN$_x$ film deposited using a TaCl$_5$ precursor would be expected to perform similarly since other TaN$_x$ based films had properties that were effectively between TaF$_5$ and TaBr$_5$ precursors.

The H$_2$ plasma treatment process appeared to cause a fundamental change in the electrical and/or morphological properties of the TaN$_x$ films. The resistivities were much lower than resistivities previously measured with TaN$_x$ films deposited by either PVD or organometallic chemical vapor deposition (OMCVD) when x>1. The microstructure of the TaN$_x$ film also changed from a rough to a smooth surface with the cycled deposition and plasma treatment.

Step coverage remained near 100% for all structures tested with aspect ratios greater than 4:1 and did not appear to be influenced by implementation of the plasma treatment. Impurity levels were estimated to be less than 2 atomic concentration percent. Deposition rates remained greater than 100 Å for all thermal CVD steps; however, the length of the plasma treatment reduced the effective deposition rate to less than 100 Å per minute in some cases. Plasma treatment times in the range of between 10 seconds and 240 seconds have been evaluated. It has been determined that, within this range, longer treatment times yield films with lower resistivities for the material.

Copper diffusion barrier properties of the resulting TaN$_x$ films are expected to be good. One contributing factor may be the nitrogen rich process, since this is known to improve barrier performance. Another factor may be the generally amorphous structure of the material, since it is known that an amorphous material, defined as having a low fraction of crystalline structure, provides a better barrier.

Figure 3:
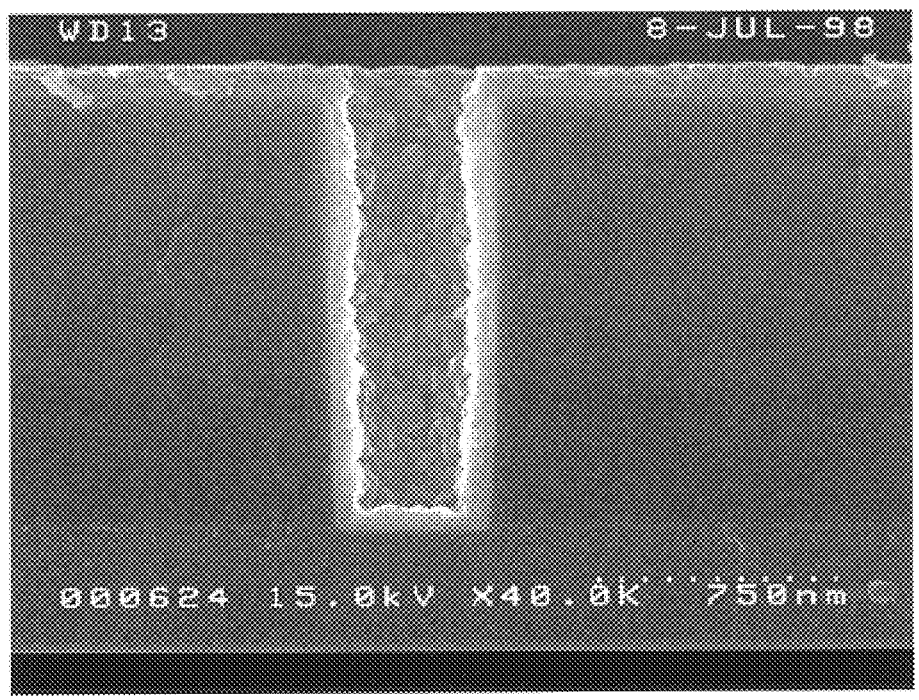
FIG. 3 is a photograph of a scanning electron micrograph (SEM) of a tantalum nitride ($TaN_x$) film deposited using a tantalum pentafluoride ($TaF_5$) precursor deposited by thermal chemical vapor deposition (CVD).
Figure 4:
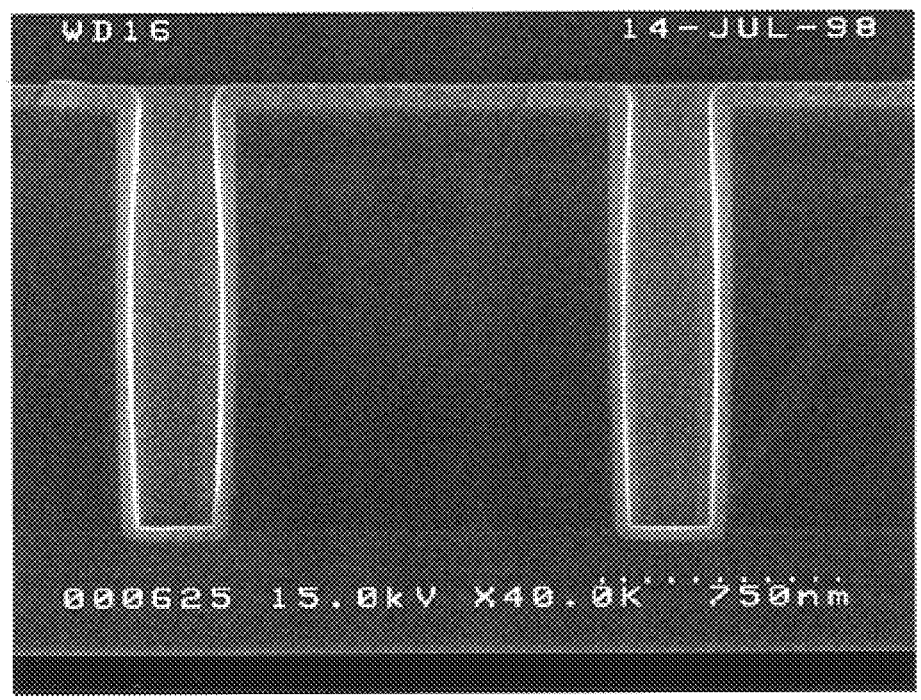
FIG. 4 is a photograph of a SEM of a $TaN_x$ film deposited using a $TaF_5$ precursor deposited by plasma treated thermal CVD (PTTCVD).
Figure 5:
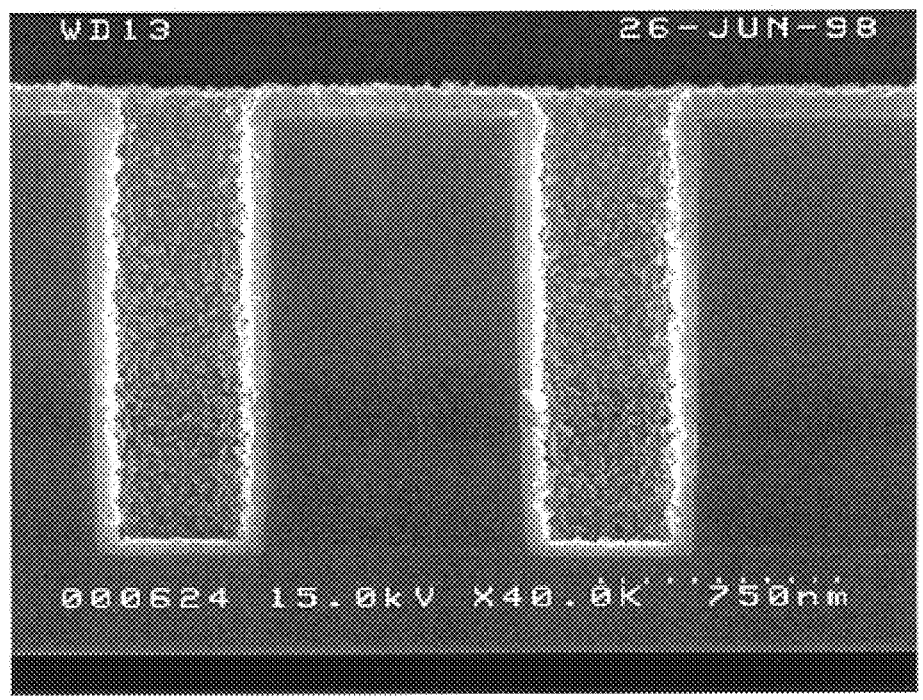
FIG. 5 is a photograph of a SEM of a $TaN_x$ film deposited using a tantalum pentabromide ($TaBr_5$) precursor deposited by thermal CVD.
Figure 6:
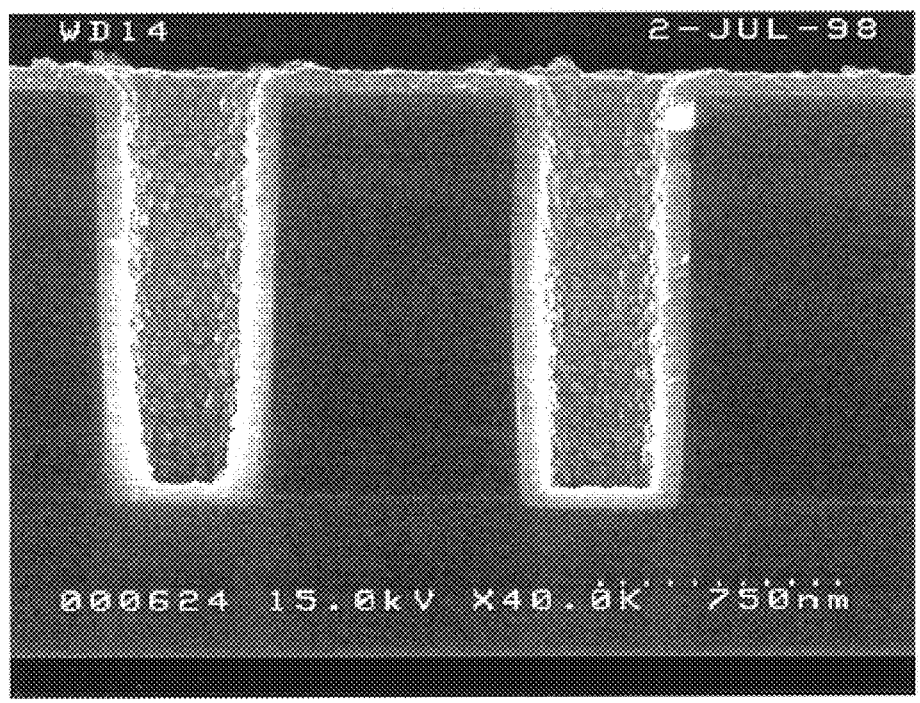
FIG. 6 is a photograph of a SEM of a $TaN_x$ film deposited using a $TaBr_5$ precursor deposited by PTTCVD.

Selected photographs of films deposited by both thermal CVD and PTTCVD according to the invention and analyzed by scanning electron microscopy (SEM) are shown in FIGS. 3–6. FIGS. 3 and 4 represent TaN$_x$ films using TaF$_5$ precursors, deposited by either thermal CVD (FIG. 3) or PTTCVD (FIG. 4). FIGS. 5 and 6 represent TaN$_x$ films using TaBr$_5$ precursors, deposited by either thermal CVD (FIG. 5) or PTTCVD (FIG. 6). Each of the figures shows a 3:1 aspect ratio structure with representative bottom step coverage and side wall coverage for the respective precursors. The step coverage represents the film thickness on the bottom of the feature divided by the film thickness on the surface of the substrate adjacent the feature, also called the field. An ideal step coverage is 1.0 or 100%, representing identical thickness on the bottom as on the field.

The effect of the plasma treatment was most striking on both the microstructural and electrical properties of TaN$_x$ films deposited using TaF$_5$ precursors. As shown in FIGS. 3 and 4 and from Table 3, the TaF$_5$ precursor film had a step coverage of 1.0 (100%). The films generally appeared to have dense morphologies. Films deposited using TaBr$_5$ had a step coverage of 0.6, 1 and 1 based on three films analyzed. TaBr$_5$ based films deposited by PTTCVD generally appeared to be smoother than the TaF$_5$ based films deposited by PTTCVD. It is presumed that TaCl$_5$ based films deposited by PTTCVD would have an appearance intermediate to the TaF$_5$ and TaBr$_5$ films, based on experience with other TaN$_x$ films using the same precursors.

Figure 7:
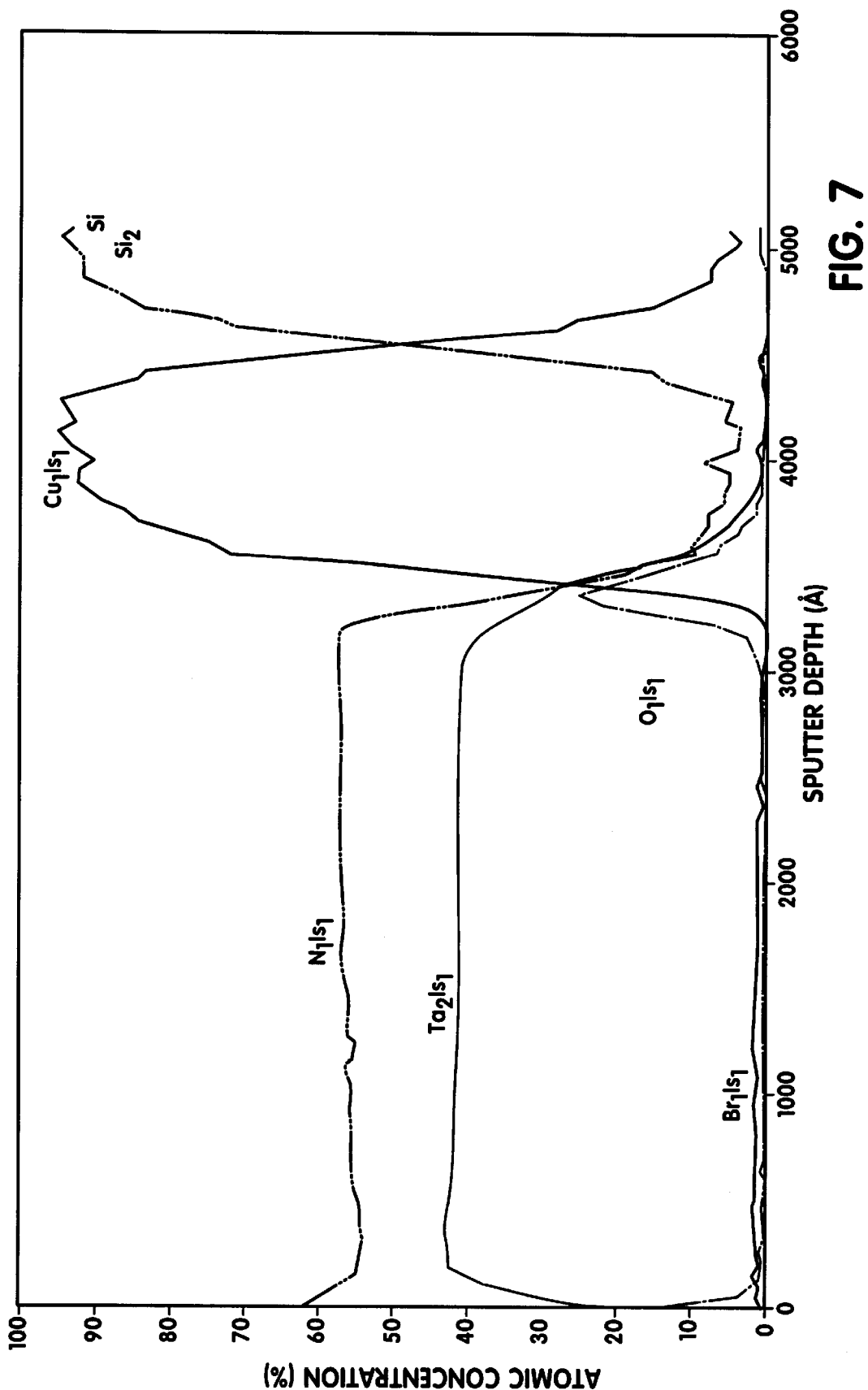
FIG. 7 is an Auger spectrum tracing of a $TaN_x$ film deposited by thermal CVD using a $TaBr_5$ precursor deposited on a Cu/TiN/Si stack.

Selected films were also evaluated by Auger electron spectroscopy. An Auger analysis spectrum is shown in FIG. 7 with TaBr$_5$ used as the precursor for depositing TaN$_x$ directly on a Cu surface in a Cu/TiN/Si stack. Analysis of the Auger spectrum confirmed the clean interface and the minimal diffusion between the Cu and TaN$_x$ layers. This suggested that little or no attack of the Cu surface occurred during the PTTCVD TaN$_x$ deposition. The analysis also confirmed the low level of bromide impurities present in the film, which was <2 atomic percent as noted from Table 3. FIG. 7 also indicated that the TaN$_x$ film was N$_2$ rich (x>1.0), which was consistent with the results shown in Table 3. Nitrogen rich TaN$_x$ films (x>1) are expected to have a relatively high electrical resistivity. TaN$_x$ films deposited using TaF$_5$ as the precursor appeared the most promising due to their lower resistivity and smoother microstructure.

Therefore, a method of producing high quality PTTCVD TaN$_x$ films suitable for integration with IC interconnect elements that contain Cu has been demonstrated. The method is based on the vapor delivery of either TaF$_5$, TaCl$_5$ or TaBr$_5$ precursors. All of the resulting TaN$_x$ films demonstrated excellent step coverage, low residual impurity concentrations, sufficiently high deposition rates and no signs of TaN$_x$ etching of Cu.

It should be understood that the embodiments of the present invention shown and described in the specification are only preferred embodiments of the inventors who are skilled in the art and are not limiting in any way. For example, Ta films may be deposited by PECVD, and TaN films may be deposited by either thermal CVD alone or plasma enhanced CVD as disclosed in, respectively, PECVD OF Ta FILMS FROM TANTALUM HALIDE PRECURSORS, THERMAL CVD OF TaN FILMS FROM TANTALUM HALIDE PRECURSORS and PLASMA ENHANCED CVD OF TaN FILMS FROM TANTALUM HALIDE PRECURSORS, all of which are invented by Hautala and Westendorp, assigned to Tokyo Electron Limited, are copending applications filed on the same date as the present application and are expressly incorporated by reference herein in their entirety. Furthermore, $TaN_x$ may be used for plug fill according to the invention as disclosed in CVD $TaN_x$ PLUG FORMATION FROM TANTALUM HALIDE PRECURSORS, invented by Hautala and Westendorp and assigned to Tokyo Electron Limited, which is a copending application filed on the same date as the present application and which is expressly incorporated by reference herein in its entirety. Therefore, various changes, modifications or alterations to these embodiments may be made or resorted to without departing from the spirit of the invention and the scope of the following claims.

What is claimed is:

1. A method of depositing a tantalum nitride ($TaN_x$) film on a semiconductor device substrate having a temperature in the range of about 300° C. to 500° C., the method comprising providing a vapor of a tantalum halide precursor selected from the group consisting of tantalum pentachloride and tantalum pentafluoride to a reaction chamber containing said substrate by heating said precursor to a temperature sufficient to vaporize said precursor, then combining said vapor with a process gas consisting essentially of nitrogen and one or more of hydrogen, argon and helium, depositing said $TaN_x$ on said substrate by a thermal chemical vapor deposition (CVD) process and plasma treating said deposited $TaN_x$ with a hydrogen-containing gas.

2. The method of claim 1 further comprising repeating said depositing by thermal CVD and said plasma treating to produce a desired thickness of said film.

3. The method of claim 2 wherein said substrate includes a feature to be filled and said depositing and said plasma treating are repeated until said feature is completely filled to thereby form a $TaN_x$ plug.

4. The method of claim 1 wherein said providing of said vapor includes producing said vapor at a pressure of at least about 3 Torr.

5. The method of claim 4 wherein said precursor is tantalum pentafluoride and said temperature is about 95° C.

6. The method of claim 4 wherein said precursor is tantalum pentachloride and said temperature is about 145° C.

7. The method of claim 1 wherein said heating of said precursor is to a temperature sufficient to provide a vapor pressure of said tantalum halide precursor of at least 3 Torr.

8. The method of claim 1 wherein said delivery of said tantalum halide precursor in the range of about 1–50 sccm.

9. The method of claim 1 wherein said process gas includes hydrogen gas at a flow of about 0.1–10 slm.

10. The method of claim 1 wherein said process gas is at a flow in the range of about 0.1–10 slm.

11. The method of claim 1 wherein said depositing occurs at a pressure of said chamber in the range of about 0.2–5.0 Torr.

12. The method of claim 1 wherein said film is integral with a copper layer of said substrate.

13. The method of claim 1 wherein said $TaN_x$ is deposited at a rate of at least about 100 Å/min.

14. The method of claim 1 wherein said substrate comprises an integrated circuit containing a high aspect ratio feature.

15. The method of claim 1 wherein said depositing is stopped prior to beginning said plasma treatment.

16. The method of claim 15 wherein said depositing is stopped by halting a flow of said precursor gas and said process gas in said chamber.

17. The method of claim 15 wherein said thermal CVD is stopped by redirecting a flow of said precursor gas and said process gas in said chamber.

18. The method of claim 1 wherein said plasma treatment is generated by a radiofrequency energy source.

19. The method of claim 1 wherein said tantalum halide precursor is delivered to said reaction chamber without a carrier gas.

20. The method of claim 1 further comprising depositing and treating said $TaN_x$ film sequentially with a tantalum film.

21. A method of depositing a tantalum nitride ($TaN_x$) film on a semiconductor device substrate having a temperature in the range of about 300° C. to 500° C., the method comprising providing a vapor of a tantalum pentafluoride precursor to a reaction chamber containing said substrate by elevating a temperature of said precursor sufficient to produce a vapor of said precursor to provide a pressure to deliver a tantalum vapor, combining said vapor with a process gas consisting essentially of nitrogen and hydrogen and optional inert gases, depositing said $TaN_x$ on said substrate by a thermal chemical vapor deposition (CVD) process and plasma treating said deposited $TaN_x$ film.

22. The method of claim 21 further comprising repeating said depositing by thermal CVD and said plasma treating to produce a desired thickness of said film.

23. The method of claim 21 wherein said elevated temperature is less than a temperature that would cause a reaction between said precursor vapor and said process gas.

24. The method of claim 21 wherein said pressure to deliver said tantalum vapor is at least about 3 Torr.

25. The method of claim 21 wherein said elevated temperature is about 95° C.

26. The method of claim 21 wherein said substrate includes a feature to be filled and said depositing and said plasma treating are repeated until said feature is completely filled to thereby form a $TaN_x$ plug.

27. The method of claim 21 wherein said thermal CVD is stopped prior to beginning said plasma treatment.

28. A method of depositing a tantalum nitride ($TaN_x$) film on a semiconductor substrate having a temperature in the range of about 300° C. to 500° C., the method comprising providing a vapor of a tantalum pentafluoride precursor to a reaction chamber containing said substrate without a carrier gas by elevating a temperature of said precursor sufficient to produce a vapor of said precursor, combining said vapor with a process gas consisting essentially of nitrogen and hydrogen and optional inert gases, depositing said $TaN_x$ on said substrate by a thermal chemical vapor deposition (CVD) process and plasma treating said deposited $TaN_x$.

29. The method of claim 28 wherein said elevated temperature is in the range of about 83° to about 95° C.

30. The method of claim 29 wherein said elevated temperature is about 95° C.

31. The method of claim 28 further comprising repeating said depositing by thermal CVD and said plasma treating to produce a desired thickness of said film.

32. A semiconductor device substrate having an underlying dielectric layer and comprising a copper (Cu) layer and a tantalum nitride ($TaN_x$) layer wherein said $TaN_x$ layer is deposited by delivering a tantalum halide precursor selected from the group consisting of tantalum pentafluoride and tantalum pentachloride to a reaction chamber containing said substrate having a temperature in the range of about 300° C. to 500° C. with said precursor heated to a temperature sufficient to vaporize said precursor, combining said vapor with a process gas consisting essentially of nitrogen and one or more of hydrogen, argon, and helium, depositing said $TaN_x$ on said substrate by a thermal chemical vapor deposition (CVD) process and plasma treating said deposited $TaN_x$ with a hydrogen-containing gas wherein said $TaN_x$ prevents diffusion of said Cu into said underlying dielectric layer and has less than about 2 atomic percent impurities.

33. A method of depositing a tantalum nitride ($TaN_x$) film on a semiconductor device substrate comprising the steps of (a) providing a vapor of a tantalum halide precursor selected from the group consisting of tantalum pentachloride and tantalum pentafluoride to a reaction chamber containing said substrate having a temperature in the range of about 300° C. to 500° C. by heating said precursor to a temperature sufficient to vaporize said precursor, then combining said vapor with a process gas consisting essentially of nitrogen and hydrogen and optional inert gases, (b) depositing said $TaN_x$ on said substrate by a thermal chemical vapor deposition (CVD) process and plasma treating said deposited $TaN_x$, and (c) repeating steps (a) and (b) to produce a desired thickness of said film.

34. A method of depositing a tantalum nitride ($TaN_x$) film on a semiconductor device substrate having a temperature in the range of about 300° C. to 500° C., the method comprising providing a vapor of a tantalum pentafluoride precursor to a reaction chamber containing said substrate by heating said precursor to a temperature of about 95° C. sufficient to vaporize said precursor to provide a pressure of at least about 3 Torr, then combining said vapor with a process gas consisting essentially of nitrogen and hydrogen and optional inert gases, depositing said $TaN_x$ on said substrate by a thermal chemical vapor deposition (CVD) process and plasma treating said deposited $TaN_x$.

35. A method of depositing a tantalum nitride ($TaN_x$) film on a semiconductor device substrate having a temperature in the range of about 300° C. to 500° C., the method comprising providing a vapor of a tantalum pentaflloride precursor to a reaction chamber containing said substrate by heating said precursor to a temperature of about 95° C. sufficient to vaporize said precursor to provide a pressure of at least about 3 Torr, then combining said vapor with a process gas consisting essentially of nitrogen and hydrogen and optional inert gases, depositing said $TaN_x$ on said substrate by a thermal chemical vapor deposition (CVD) process and plasma treating said deposited $TaN_x$.

36. A method of depositing a tantalum nitride ($TaN_x$) film on a semiconductor device substrate having a temperature in the range of about 300° C. to 500° C., the method comprising providing a vapor of a tantalum halide precursor selected from the group consisting of tantalum pentachloride and tantalum pentafluoride to a reaction chamber containing said substrate by heating said precursor to a temperature sufficient to vaporize said precursor, then combining said vapor with a process gas consisting essentially of nitrogen and hydrogen and optional inert gases, depositing said $TaN_x$ on said substrate by a thermal chemical vapor deposition (CVD) process, then stopping said depositing by halting a flow of said precursor gas and said process gas in said chamber and subsequently plasma treating said deposited $TaN_x$.

37. A method of depositing a tantalum nitride ($TaN_x$) film on a semiconductor device substrate having a temperature in the range of about 300° C. to 500° C., the method comprising providing a vapor of a tantalum halide precursor selected from the group consisting of tantalum pentachloride and tantalum pentafluoride to a reaction chamber containing said substrate by heating said precursor to a temperature sufficient to vaporize said precursor, then combining said vapor with a process gas consisting essentially of nitrogen and hydrogen and optional inert gases, depositing said $TaN_x$ on said substrate by a thermal chemical vapor deposition (CVD) process, then stopping said depositing by redirecting a flow of said precursor gas and said process gas in said chamber and subsequently plasma treating said deposited $TaN_x$.

38. A method of depositing a tantalum nitride ($TaN_x$) film on a semiconductor device substrate having a temperature in the range of about 300° C. to 500° C., the method comprising providing a vapor of a tantalum halide precursor selected from the group consisting of tantalum pentachloride and tantalum pentafluoride to a reaction chamber containing said substrate by heating said precursor to a temperature sufficient to vaporize said precursor, then combining said vapor with a process gas consisting essentially of nitrogen and hydrogen and optional inert gases, depositing said $TaN_x$ on said substrate by a thermal chemical vapor deposition (CVD) process and plasma treating said deposited $TaN_x$, wherein said plasma treatment is generated by a radiofrequency energy source.

* * * * *

UNITED STATES PATENT AND TRADEMARK OFFICE
CERTIFICATE OF CORRECTION

PATENT NO. : 6,268,288 B1  
DATED : July 31, 2001  
INVENTOR(S) : Hautala et al.

Page 1 of 1

It is certified that error appears in the above-identified patent and that said Letters Patent is hereby corrected as shown below:

<u>Title page, Item [54], and Column 1, line 1,</u>  
The Title reads "TAN" and should read -- TaN --.

<u>Column 3,</u>  
Line 65, reads "(TaI$_5$)" and should read -- (TaI$_5$) --.

<u>Column 4,</u>  
Line 9, reads "(TaI$_5$)" and should read -- (TaI$_5$) --.

<u>Column 5,</u>  
Line 9, reads "(TiI$_4$)" and should read -- (TiI$_4$) --.

<u>Column 6,</u>  
Line 3, reads "(TaI$_5$)" and should read -- (TaI$_5$) --.  
Line 11, reads "(TiI$_4$)" and should read -- (TiI$_4$) --.  
Line 62, reads "vaporator" and should read -- evaporator --

<u>Column 8,</u>  
Line 3, reads "(TaI$_5$)" and should read -- (TaI$_5$) --.  
Lines 13 and 18, reads "(TaI$_5$)" and should read -- (TaI$_5$) --.  
Line 65, paragraph is in small font as if it were a footnote when it should be a regular paragraph.

<u>Column 9,</u>  
Lines 17, 21, 22, 24, 27, 28 and 29, read "$\mu\omega$cm" and should read -- $\mu \Omega$cm --.

Signed and Sealed this

Nineteenth Day of March, 2002

Attest:

*Attesting Officer*

JAMES E. ROGAN  
*Director of the United States Patent and Trademark Office*